(12) United States Patent
Sudo et al.

(10) Patent No.: US 6,801,033 B2
(45) Date of Patent: Oct. 5, 2004

(54) VOLTAGE CONVERTER HAVING SWITCHING ELEMENT WITH VARIABLE SUBSTRATE POTENTIAL

(75) Inventors: Minoru Sudo, Chiba (JP); Jun Osanai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/401,360

(22) Filed: Mar. 28, 2003

(65) Prior Publication Data

US 2003/0173594 A1 Sep. 18, 2003

Related U.S. Application Data

(62) Division of application No. 09/790,763, filed on Feb. 22, 2001, now Pat. No. 6,586,958.

(51) Int. Cl.[7] .............................................. G01R 31/26
(52) U.S. Cl. .................... 324/158.1; 324/765; 324/769; 323/282

(58) Field of Search ................................ 324/765, 768, 324/158.1, 416, 73.1; 323/222, 282, 284–285, 299

(56) References Cited

U.S. PATENT DOCUMENTS

| | | | | | |
|---|---|---|---|---|---|
| 5,883,505 | A | * | 3/1999 | Magazzu' et al. | 323/282 |
| 5,998,981 | A | * | 12/1999 | Houghton et al. | 323/282 |
| 6,037,760 | A | * | 3/2000 | Borghi et al. | 323/282 |
| 6,278,265 | B1 | * | 8/2001 | Yokosawa | 323/282 |
| 6,320,449 | B1 | * | 11/2001 | Capici et al. | 327/435 |
| 6,369,558 | B2 | * | 4/2002 | Umemoto | 323/282 |

* cited by examiner

Primary Examiner—David A. Zarneke
Assistant Examiner—Minh N. Tang
(74) Attorney, Agent, or Firm—Adams & Wilks

(57) ABSTRACT

In order to improve drive performance of a voltage regulator (on resistance of an output transistor) while suppressing increases in surface area resistance of an output transistor is reduced by changing the threshold voltage of the output transistor by controlling the back-gate voltages of output transistors of a voltage regulators.

17 Claims, 7 Drawing Sheets

VOLTAGE CONVERTER HAVING SWITCHING ELEMENT WITH VARIABLE SUBSTRATE POTENTIAL

This application is a Division of Application Ser. No. 09/790,763 filed Feb. 22, 2001 now U.S. Pat. No. 6,586,958

BACKGROUND OF THE INVENTION

1. Field of the Invention

This invention relates to a semiconductor integrated capable of increasing drive performance by changing a substrate potential of a MOS transistor (back gate voltage) when a NOS transistor is employed as an output transistor of a voltage converter such as a voltage regulator (referred to herein as a V/R circuit) in an integrated circuit, a charge pump circuit (hereinafter referred to as CP circuit), or a switching element (hereinafter referred to as SW element) of a switching regulator.

2. Description of Related Art

Voltage regulators outputting a related positive voltage such as shown in the circuit diagram of FIG. 9 are well-known. Namely, a related voltage regulator comprises a voltage regulator control circuit consisting of an error amplifier 13 for amplifying a difference voltage for a reference voltage Vref of a reference voltage circuit 10 and a voltage of a connection point of bleeder resistors 11, 12 dividing a voltage Vout (referred to as output voltage in the following) of a voltage regulator output terminal 5, and an output transistor 14. A positive power supply voltage VDD is applied to a power supply voltage terminal 15.

If an output voltage of the error amplifier 13 is taken to be Verr, an output voltage of the reference voltage circuit 10 is taken to be Vref, and a voltage of a connection point of the bleeder resistors 11, 12 is taken to be Va, then, if Vref>Va, Verr becomes low, while conversely, if Vref<Va, then Verr becomes high.

The output transistor 14 is a p-channel MOS transistor in this case. Therefore, when Verr becomes low, the voltage across the gate and source becomes large, the on resistance becomes small and operation is such that the output voltage Vout is caused to rise. Conversely, when Verr goes high, operation is such that the on resistance of the output transistor 14 goes high, and the output voltage goes low, so that the output voltage Vout is kept at a fixed value.

An ON resistance Ron of the output transistor 14 constitutes a function for the voltage Vgs between the gate and source and a transistor threshold voltage Vt, with the ON resistance of the transistor being smaller than Vgs−Vt. Typically, the ON resistance for the region where the voltage across the drain and source of the transistor is small is given by the equation (1).

$$Ron = \frac{1}{\mu \cdot Cox \cdot W / L \cdot (Vgs - Vt)} \quad (1)$$

Here, $\mu$ is mobility, Cox is gate capacitance per unit surface area, W is transistor gate width, and L is gate length.

It is necessary to increase the gate width W of the transistor in order to lower the ON resistance of the output transistor. This increases the surface area of the IC and therefore causes costs to increase.

On the other hand, voltage regulators of the related art outputting a negative voltage, such as shown in the circuit diagram of FIG. 10, are well-known. Namely, a related voltage regulator comprises a voltage regulator control circuit consisting of an error amplifier 13 for amplifying a difference voltage for a reference voltage of a reference voltage circuit 10 and a voltage of a connection point of bleeder resistors 11, 12 dividing a voltage−Vout of a voltage regulator output terminal 5, and an output transistor 17. A negative power supply voltage−VSS is applied to a power supply voltage terminal 16. If an output voltage of the error amplifier 13 is taken to be −Verr, an output voltage of the reference voltage circuit 10 is taken to be −Vref, and a voltage of a connection point of the bleeder resistors 11, 12 is taken to be −Va, then, if −Vref<−Va, −Verr becomes low (approaches −VSS), while conversely, if −Vref>−Va, then −Verr becomes high (approaches GND).

An output transistor 17 is an N-channel MOS transistor in this case. Therefore, when −Verr becomes high, the voltage across the gate and source becomes large, the ON resistance becomes small and operation is such that the output voltage Vout is caused to fall. Conversely, when −Verr goes low, operation is such that the ON resistance of the output transistor 17 goes high, and the output voltage goes high, so that the output voltage Vout is kept at a fixed value.

As with the positive voltage regulator, it is necessary to increase the gate width W of the output transistor in order to lower the on resistance of the output transistor, with the on resistance of the output transistor being given by equation (1). This increases the surface area of the IC and therefore causes costs to increase.

A configuration for a circuit taken as a related booster-type SW regulator is shown in FIG. 11.

An input power supply 120 is connected to a coil 121 and a power supply terminal 101 of an SW regulator control circuit 130. The other end of the coil 121 is connected to a drain of an SW element 122 and an anode of a commutation diode 123. A cathode of the diode 123 is connected to an output voltage terminal 102 of the SW regulator, and a capacitor 124 and a load 125 are connected to the output voltage terminal 102. If a voltage of an output voltage terminal 102 is taken to be Vout, the SW regulator control circuit 130 controls the SW element 122 to be on or off in such a manner that Vout is fixed. The gate of the SW terminal 122 is connected to the terminal 103 of the drive circuit 131 of the SW element, and the SW element 122 is made to go on and of f as a result of being driven by the voltage Vext of the terminal 103. In FIG. 11, the SW element 122 is an N-channel MOS transistor. The voltage Vext of the output terminal 103 of the drive circuit 131 is outputted as a positive voltage "H" in order to put the SW element 122 on, and is outputted as a GND level voltage in order to put the SW element 122 off. The source and substrate of the SW element 122 are both connected to GND.

Generally, it is preferable for the electrical power conversion efficiency of the SW regulator circuit to be high. It is necessary for the electrical power conversion efficiency to be high in order to reduce loss due to on resistance when the SW element 122 is on. If current flowing in the SW element 122 is taken to be I, and on resistance of the SW element is taken to be Ron, then loss Pron when the SW element 122 is on is given by:

$$Pron = I \times I \times Ron \quad (2)$$

i.e., it is necessary to lower the on resistance of the SW element in order to make the loss Pron of the SW element small. Typically, the on resistance for the region where the voltage across the drain and source of the MOS transistor is small is given by equation (1) described previously.

It is necessary to increase the gate width W of the transistor in order to lower the on resistance of the MOS transistor. This increases the surface area of the IC and therefore causes costs to increase. Making the gate width W large also increases the capacitance of the gate of the. MOS transistor so that loss when charging and discharging the gate capacitance of the MOS transistor when turning the MOS transistor on and off is also increased. The surface area of the drive circuit itself also increases in order to drive this large capacitance.

The configuration of a circuit shown in FIG. 12 is given as an example of a related double-boosting-type circuit. The positive side of a power supply 220 of the input of FIG. 12 is connected to switch elements 221 and 224, and the negative side of the power supply 220 is connected to the SW terminal 222. A capacitor 225 and SW element 223 are connected to the other end of the SW element 221, with a SW element 224 being connected to the other end of the capacitor 225. A capacitor 226 and load 227 are connected to the other end of the SW element 223. The switch elements 221 to 224 are controlled to go on and off by a signal from a CP control circuit 228.

The switch elements 221 and 222, and 223 and 224 go on and off in a complementary manner, i.e. when switch elements 221 and 222 are on, switch elements 223 and 224 are off, and when switch elements 223 and 224 are on, switch elements 221 and 222 are off. These switch elements then repeatedly go on and off in an alternate manner. Initially, when the switch elements 221 and 222 are on for a sufficiently long time, a voltage the same as the voltage of the power supply 220 is stored at the capacitor 225. If the voltage of the power supply 220 is taken to be VDD, then the voltage VDD is stored at the capacitor 225.

Next, when the SW elements 221 and 222 are turned off and the SW elements 223 and 224 are put on, the voltage of the capacitor 225 on the side of the SW element 224 becomes the voltage of the power supply 220, i.e. VDD, and the charge of the capacitor 225 is stored. The voltage of the SW element 223 for the voltage of the capacitor 225 then becomes 2×VDD. This voltage is held at the capacitor 226 and is supplied to the load 227.

The turning on and off of the SW element 16 generally carried out at a frequency in the order of a number of kHz to a number of Mhz. Ideally, it is preferable for the SW elements to have an on resistance of 0Ω and to charge and discharge electrical charge of the capacitance instantaneously. However, in reality, charging and discharging is carried out based on the time constants of the capacitors and the SW elements due to the on resistance of the switch elements.

Loss is also generated during the charging and discharging of the SW elements due to the resistance components of the SW elements.

Generally, it is preferable for the electrical power conversion efficiency of the CP circuit to be high. It is necessary for the electrical power conversion efficiency to be high in order to reduce loss due to ON resistance when the SW elements 221 to 224 are on. If current flowing in the SW element is taken to be I, and on resistance of the SW element is taken to be Ron, then it is necessary to lower the on resistance of the SW element in order to make the loss Pron of the SW element smaller, as can be given by the aforementioned equation (2).

An example where SW elements 222 and 224 are configured from an N-channel MOS transistor and a P-channel MOS transistor is shown in FIG. 13. Numeral 230 in FIG. 13 is an N-channel MOS transistor playing the role of the SW element 222 of FIG. 12, and numeral 231 is a PMOS transistor, playing the role of the SW element 224 of FIG. 12. In FIG. 13, the source and substrate of the P-channel MOS transistor 231 are connected to the positive power supply VDD. On the other hand, the source of the N-channel MOS transistor 230 and the substrate are connected to the negative power supply GND.

When the SW elements are made using MOS transistors, the on resistance for the region of the MOS transistor where the voltage across the drain and source is small and is given by equation (1) as described above.

It is necessary to increase the gate width W of the transistor in order to lower the on resistance of the switch elements made form MOS transistors. This increases the surface area of the IC and therefore causes costs to increase. Making the gate width W large also increases the capacitance of the gate of the MOS transistor so that loss when charging and discharging the gate capacitance of the MOS transistor when turning the MOS transistor on and off is also increased. The surface area of the drive circuit itself also increases in order to drive this large capacitance.

In order to resolve the problems encountered in the related art, the object of the present invention is to lower MOS transistor ON resistance while suppressing increases in the surface area of MOS transistors of switching elements.

SUMMARY OF THE INVENTION

DETAILED DESCRIPTION OF THE PREFERRED EMBODIMENTS

In order to resolve the aforementioned problems, in this invention, a substrate voltage switching circuit is provided for output transistors of a voltage regulator circuit SW regulators or SW elements of a CP circuit so that when the SW element is on, the substrate voltage of the SW element is changed so that the threshold voltage of the SW element falls and the on resistance of the SW element therefore falls.

First Embodiment

Figure 1:
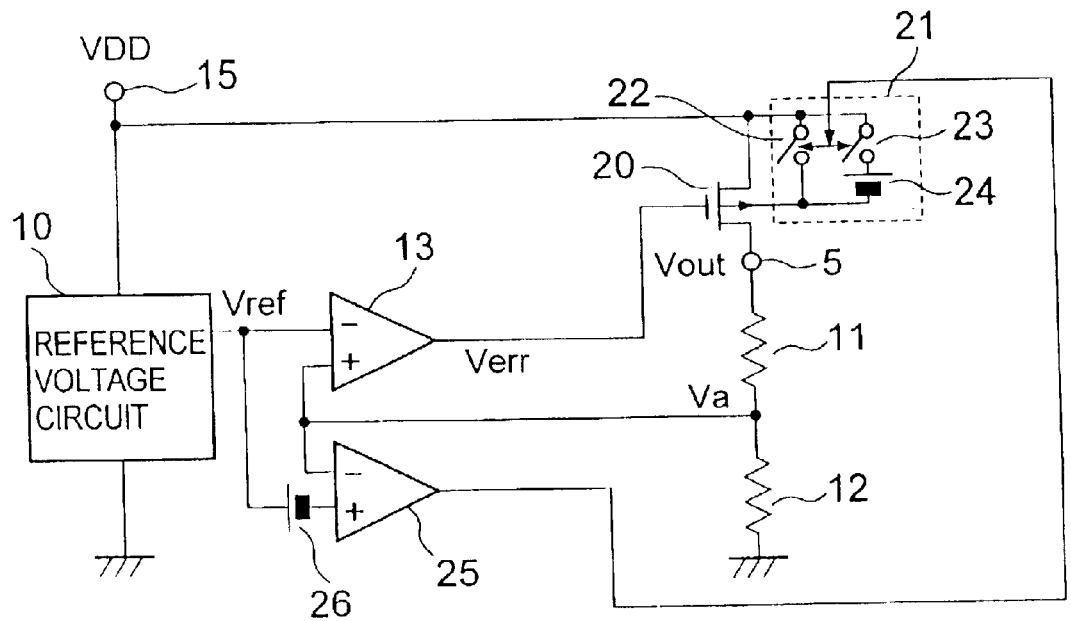
FIG. 1 is a view illustrating a voltage regulator circuit of a first embodiment of the present invention.

The following is a description, based on the drawings, of preferred embodiments of the present invention. FIG. 1 is a V/R circuit diagram showing a first embodiment of the present invention. The reference voltage circuit 10, bleeder resistors 11 and 12, and error amplifier 13 are the same as for the related voltage regulator for outputting a positive voltage.

In the circuit of the related art, the substrate potential of the output transistor 20 is connected to the power supply voltage VDD of the positive power supply voltage terminal 15 but is changed in the present embodiment by the substrate voltage switching circuit 21. The substrate potential of the transistor 20 can be switched by the output signal of the comparator 25. The comparator 25 takes a voltage Va of a connection point of bleeder resistors 11 and 12 and a voltage that is the voltage V26 of the offset voltage power supply 26 subtracted form the output voltage Vref of the reference voltage circuit 10, i.e. Vref−V26, as input, so that if Va>(Vref−V26), the output of the comparator 25 is high, and conversely if Va<(Vref−V26), the output of the comparator 25 is low. The switch 22 of the substrate voltage switching circuit 21 goes on when the output of the comparator 25 is high, i.e. the substrate potential of the transistor 20 is connected to VDD when Va>(Vref−V26).

On the other hand, the switch 23 of the substrate voltage switching circuit 21 goes on when the output of the comparator 25 is low, i.e. the substrate potential of the transistor 20 is connected to a voltage lower than VDD by a voltage V24 of a substrate voltage regulating power supply 24 when Va<(Vref−V26), i.e. is connected to VDD−V24.

When the load is relatively light, when the voltage regulator is operating normally, the voltage Verr of the error amplifier 13 changes in such a manner that the voltage Vref of the reference voltage circuit 10 and the voltage Va of the connection point of the bleeder resistors 11 and 12 become equal, i.e. so that Vref=Va. In this state, the substrate potential of the transistor 20 is connected to VDD because the switch 22 is on, so that operation is the same as for the related art.

When the load connected to the voltage regulator output terminal 5 is large, the drive performance of the transistor 20 is insufficient, the voltage Vout of the output voltage terminal 5 falls, and when this becomes Va<(Vref−V26), the substrate potential of the transistor 20 is connected to VDD−V24 because the switch 23 is on. When the substrate potential of the transistor 20 is connected to VDD−V24, a threshold voltage Vt for the transistor 20 falls. When the threshold voltage Vt falls, as shown by equation (1), the on resistance of the transistor also falls, and a larger current can therefore be supplied to the load.

The value of the voltage V24 of the substrate voltage regulating power supply 24 is taken to be a value for causing the substrate potential of the transistor 20 to fall by approximately 0.1 to 0.5V with respect to the potential of the source of the transistor 20. The threshold voltage of the transistor 20 falls more for a larger value for the voltage V24. The on resistance of the transistor 20 can therefore be lowered but when this lowering is made to exceed 0.6V with respect to the potential of the source of the transistor 20, a parasitic pn junction existing between the source and the substrate of the transistor 20 goes on. It is therefore necessary to set the voltage of V24 to a voltage value in a range where the parasitic pn junction does not go on. The substrate voltage regulating power supply 24 does not have to be a power supply, and can also be a circuit for generating a voltage V24. Further, the switches 22 and 23 can be replaced with MOS transistors playing the role of simple switches. The same results can also be obtained if the positional relationship of the switch 23 and substrate voltage regulating power supply 24 is replaced.

A value of approximately a few mV to 100 mV is appropriate as a value for the voltage V26 of the offset voltage power supply 26.

Operation can also be made more stable if the comparator 25 possesses a hysteresis function.

Second Embodiment

Figure 2:
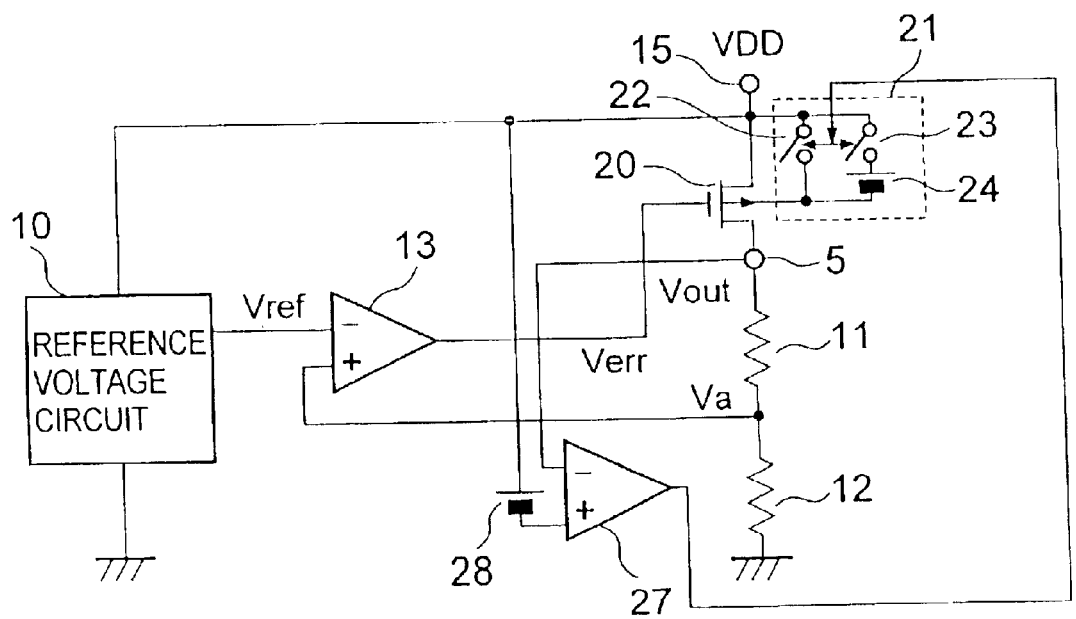
FIG. 2 is a view illustrating a voltage regulator circuit of a second embodiment of the present invention.

FIG. 2 is a V/R circuit diagram showing a second embodiment of the present invention. The reference voltage circuit 10, bleeder resistances 11 and 12, and error amplifier 13 are the same as for the related voltage regulator for outputting a positive voltage.

In the circuit of the related art, the substrate potential of the output transistor 20 is connected to the power supply voltage VDD but in the present invention the substrate potential of the transistor 20 can be changed by the substrate voltage switching circuit 21. The substrate potential of the transistor 20 can be switched by the output signal of the comparator 27. The comparator 27 takes a voltage Vout of the output terminal 5 of the voltage regulator and a voltage that is the input power supply voltage VDD of the voltage regulator with a voltage V28 of an offset voltage power supply 28 subtracted, i.e. VDD−V28, as input, and if Vout<(VDD−V28), the output of the comparator 27 becomes high. Conversely, if Vout>(VDD−V28), the output of the comparator 27 is low. The switch 22 of the substrate voltage switching circuit 21 goes on when the output of the comparator 27 is high, i.e. the substrate potential of the transistor 20 is connected to VDD when Vout<(VDD−V28). On the other hand, the switch 23 of the substrate voltage switching circuit 21 goes on when the output of the comparator 27 is low, i.e. the substrate potential of the transistor 20 is connected to a voltage lower than VDD by a voltage V24 of the substrate voltage regulating power supply 24 when Vout>(VDD−V28), i.e. is connected to VDD−V24. When the input power supply of the voltage regulator is relatively high and VDD−Vout is sufficiently large, the substrate potential of the transistor 20 is connected to VDD because the switch 22 is on, so that operation is the same as for the related art.

When the input power supply voltage VDD of the voltage regulator falls, the voltage across the gate and source for controlling the transistor 20 cannot be greater than the power supply voltage. The drive performance therefore is insufficient because the on resistance of the transistor 20 increases and the current that the voltage regulator can supply to the load falls. However, when VDD falls so that Vout>(VDD−28), the substrate potential of the transistor 20 is connected to VDD−V24 because the switch 23 is on. When the substrate potential of the transistor 20 is connected to VDD−V24, a threshold voltage Vt for the transistor 20 falls. When the threshold voltage Vt falls, as shown by equation (1), the on resistance of the transistor also falls, and a larger current can therefore be supplied to the load.

The value of the voltage V24 of the substrate voltage regulating power supply 24 is taken to be a value for causing the substrate potential of the transistor 20 to fall be approximately 0.1 to 0.5V with respect to the potential of the source of the transistor 20. The threshold voltage of the transistor 20 falls more for a larger value for the voltage V24. The on resistance of the transistor 20 can therefore be lowered but when this lowering is made to exceed 0.6V with respect to the potential of the source of the transistor 20, a parasitic pn junction existing between the source and the substrate of the transistor 20 goes on. It is therefore necessary to set the voltage of V24 to a voltage value in a range where the parasitic pn junction does not go on. Further, the switches 22 and 23 can be replaced with MOS transistors playing the role of simple switches. The same results can also be obtained if the positional relationship of the switch 23 and substrate voltage regulating power supply 24 is switched.

A value of approximately a few mV to V is appropriate as a value for the voltage V28 of the offset voltage power supply 28.

Operation can also be made more stable if the comparator 27 possesses a hysteresis function.

Third Embodiment

Figure 3:
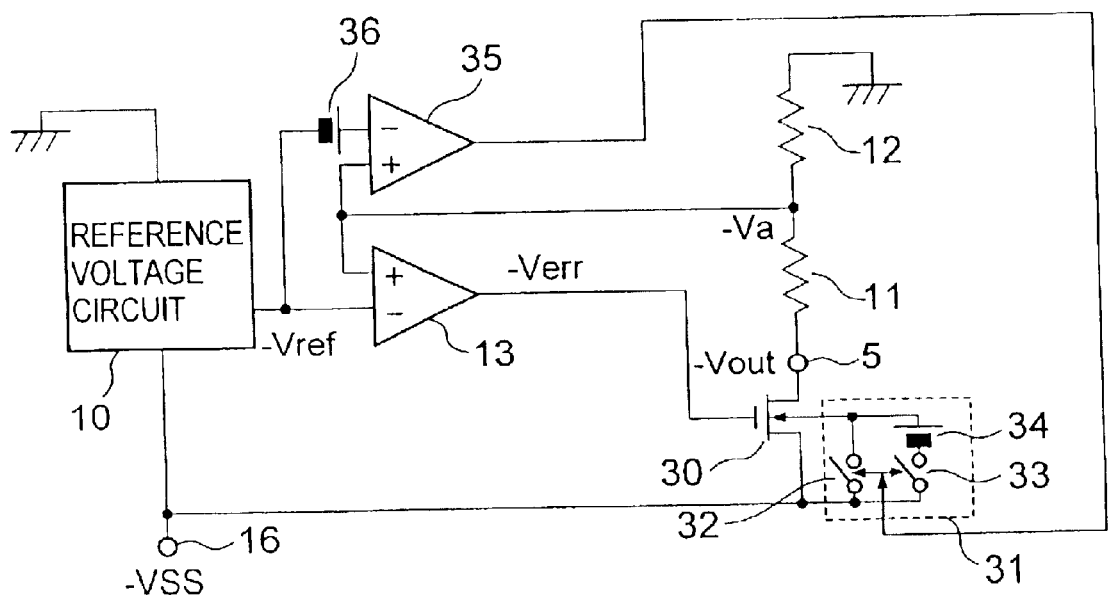
FIG. 3 is a view illustrating a voltage regulator circuit of a third embodiment of the present invention.

FIG. 3 is a V/R circuit diagram showing a third embodiment of the present invention. The reference voltage circuit 10, bleeder resistors 11 and 12, and error amplifier 13 are the same as for the related voltage regulator for outputting a negative voltage.

In the circuit of the related art, the substrate potential of the output transistor 30 is connected to the power supply voltage −VSS of the negative power supply voltage terminal 16 but in the present invention the substrate potential of the transistor 30 can be changed by the substrate voltage switching circuit 31. The substrate potential of the transistor 30 can be changed by an output signal of a comparator 35. The comparator 35 takes a voltage −Va of the connection point of the bleeder resistors 11 and 12 and a voltage that is the sum of the output voltage −Vref of the reference voltage circuit 10 and the voltage V36 of the offset voltage power supply 36, i.e. −Vref+V36, as input, and if −Va>(−Vref+V36), the output of the comparator is high, and conversely if −Va<(−Vref+V36), the output of the comparator is low. The switch 32 of the substrate voltage switching circuit 31 goes on when the output of the comparator 35 is low, i.e. the substrate potential of the transistor 30 is connected to −VSS when −Va<(−Vref+V36). On the other hand, the switch 33 of the substrate voltage switching circuit 31 goes on when the output of the comparator 35 is high, i.e. the substrate potential of the transistor 30 is connected to a voltage higher than −VSS by a voltage V34 of a substrate voltage regulating power supply 34 when −Va>(−Vref+V36), i.e. is connected to −VSS+V34.

When the load is relatively light, when the voltage regulator is operating normally, the voltage −Verr of the error amplifier 13 changes in such a manner that the voltage −Vref of the reference voltage circuit 10 and the voltage −Va of the connection point of the bleeder resistors 11 and 12 become equal, i.e. so that −Vref=−Va. In this state, the substrate potential of the transistor 30 is connected to −VSS because the switch 32 is on, so that operation is the same as for the related art.

When the load connected to the voltage regulator output terminal 5 is large, the drive performance of the transistor 30 is insufficient, the voltage −Vout of the output voltage terminal 5 rises (approaches ground) to become −Va>(−Vref+V36), and the substrate potential of the transistor 30 is connected to −VSS+V34 because the switch 33 is on. When the substrate potential of the transistor 30 is connected to −VSS+V34, a threshold voltage Vt for the transistor 30 falls. When the threshold voltage Vt falls, as shown by equation (1), the on resistance of the transistor also falls, and a larger current can therefore be supplied to the load.

The value of the voltage V34 of the substrate voltage regulating power supply 34 is taken to be a value for causing the substrate potential of the transistor 30 to fall by approximately 0.1 to 0.5V with respect to the potential of the transistor 30. The threshold voltage of the transistor 30 falls more for a larger value for the voltage V34. The on resistance of the transistor 30 can therefore be lowered but when this lowering causes a voltage in excess of 0.6V with respect to the potential of the source of the transistor 20, a parasitic pn junction existing between the source and the substrate of the transistor 30 goes on. It is therefore necessary to set the voltage of V34 to a voltage value of a range where the parasitic pn junction does not go on. Further, the switches 32 and 33 can be replaced with MOS transistors playing the role of simple switches. The same results can also be obtained if the positional relationship of the switch 33 and substrate voltage regulating power supply 34 is switched.

A value of approximately a few mV to 100 mV is appropriate as a value for the voltage V36 of the offset voltage power supply 36.

Operation can also be made more stable if the comparator 35 possesses a hysteresis function.

Fourth Embodiment

Figure 4:
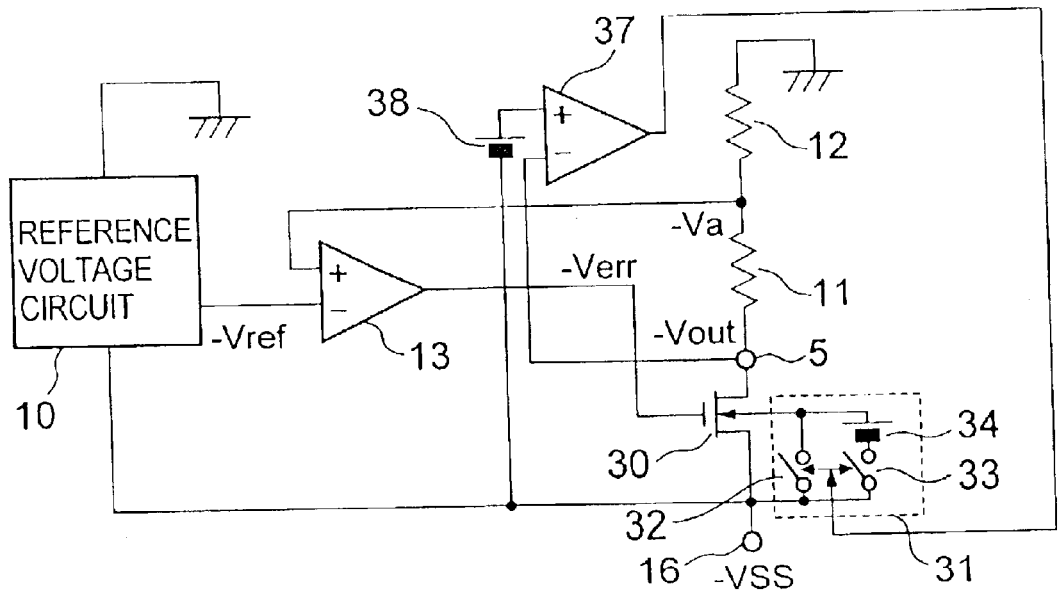
FIG. 4 is a view illustrating a voltage regulator circuit of a fourth embodiment of the present invention.

FIG. 4 is a V/R circuit diagram showing a fourth embodiment of the present invention. The reference voltage circuit 10, bleeder resistors 11 and 12, and error amplifier 13 are the same as for the related voltage regulator for outputting a negative voltage.

In the circuit of the related art, the substrate potential of the output transistor 30 is connected to the power supply voltage −VSS but in the present invention the substrate potential of the transistor 30 can be changed by the substrate voltage switching circuit 31. The substrate potential of the transistor 30 can be switched by the output signal of the comparator 37. The comparator 37 takes the voltage −Vout of output terminal 5 of the voltage regulator and a voltage that is the sum of the input power supply voltage −VSS of the voltage regulator and the voltage V38 of the offset voltage power supply 38, i.e. −VSS+V38, as input, and if −Vout<(−VSS+V38), the output of the comparator 37 is high, while conversely, if −Vout>(−VSS+V38), the output of the comparator 37 is low. The switch 32 of the substrate voltage switching circuit 31 goes on when the output of the comparator 37 is low, i.e. the substrate potential of the transistor 30 is connected to −VSS when −Vout>(−VSS+V38). On the other hand, the switch 33 of the substrate voltage switching circuit 31 goes on when the output of the comparator 37 is high, i.e. the substrate potential of the transistor 30 is connected to a voltage higher than −VSS by a voltage V34 of a substrate voltage regulating power supply 34 when −Vout<(−VSS+V38), i.e. is connected to −VSS+V34.

When the input power supply voltage −VSS of the voltage regulator is relatively low and the difference of the absolute values of −VSS and −Vout is sufficiently large, the substrate potential of the transistor 30 is connected to −VSS because the switch 32 is on, so that operation is the same as for the related art.

When the input power supply voltage −VSS of the voltage regulator falls (i.e. there is a reduction in the absolute value), the voltage across the gate and source for controlling the transistor 30 cannot be greater than the power supply voltage. The drive performance of the transistor 30 is therefore insufficient and the current that the voltage regulator can supply to the load falls. However, when −VSS falls (i.e. there is a reduction in the absolute value) so that −Vout<(−VSS+V38), the substrate potential of the transistor 30 is connected to −VSS+V34 because the switch 333 is on. When the substrate potential of the transistor 30 is connected to −VSS+V34, a threshold voltage Vt for the transistor 30 falls. When the threshold voltage Vt falls, as shown by equation (1), the on resistance of the transistor also falls, and a larger current can therefore be supplied to the load.

The value of the voltage V34 of the substrate voltage regulating power supply 34 is taken to be a value for causing the substrate potential of the transistor 30 to fall be approximately 0.1 to 0.5V with respect to the potential of the source of the transistor 30. The threshold voltage of the transistor 30 falls more for a larger value for the voltage V34. The on resistance of the transistor 30 can therefore be lowered but when this lowering causes a voltage in excess of 0.6V with respect to the potential of the source of the transistor 20, a parasitic pn junction existing between the source and the substrate of the transistor 30 goes on. It is therefore necessary to set the voltage of V24 to a voltage value of a range where the parasitic pn junction does not go on. Further, the switches 32 and 33 can be replaced with MOS transistors playing the role of simple switches. The same results can also be obtained if the positional relationship of the switch 33 and substrate voltage regulating power supply 34 is switched A value of approximately a few mV to V is appropriate as a value for the voltage V38 of the offset voltage power supply 38.

Operation can also be made more stable if the comparator 37 possesses a hysteresis function.

Fifth Embodiment

Figure 5:
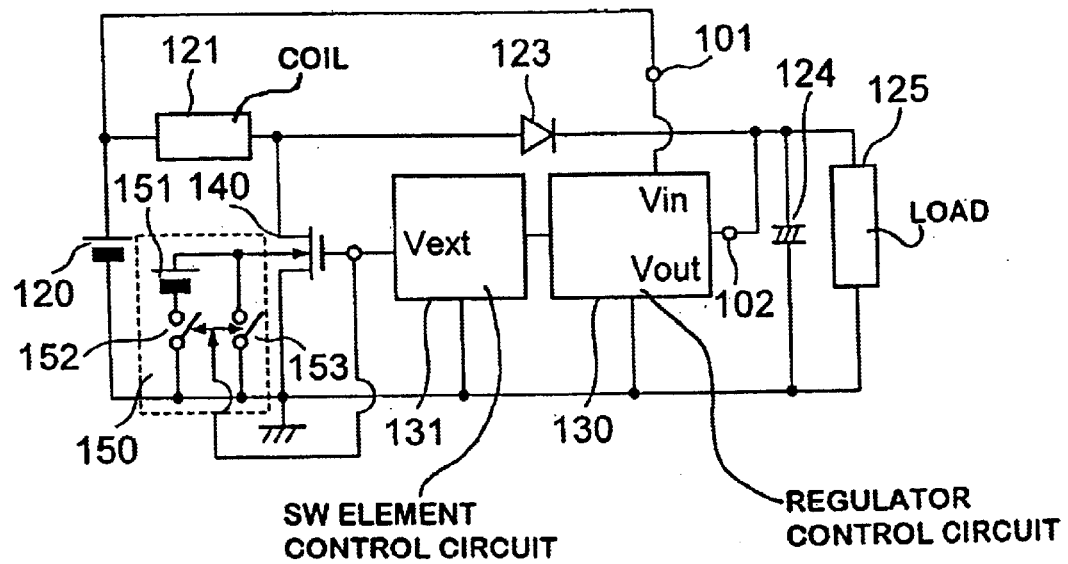
FIG. 5 is a view illustrating a booster-type SW regulator of a fifth embodiment of the present invention.

FIG. 5 is a view of an SW regulator showing a fifth embodiment of the present invention. The input power supply 120, coil 121, diode 123, SW regulator control circuit 130, capacitor 124 and load 125 are the same as for the related art. In FIG. 5, an SW element 140 is connected in place of the SW element 122 of the related art. The drain, gate, and source of the SW element 140 are connected in the same manner as for the SW element of the related art but the substrate potential of the SW element 140 can be switched by the substrate potential switching circuit 150. The substrate potential switching circuit 150 receives the same switching circuit 150 receives the same signal as for the gate of the SW element 140 and controls the turning on and off of switches 152 and 153. The SW element 140 is constructed from N-channel MOS transistors as in the case in FIG. 5. When the potential of the gate of the SW element, i.e. the voltage Vext of the terminal 103 of the SW element control circuit 131 becomes high, the SW element 140 goes on. When the Sw element is on, i.e., when Vext is high, the substrate potential switching circuit 150 puts the switch 152 on. Conversely, when the SW element is off, i.e. when Vext is low, the substrate potential switch circuit 150 puts the switch 153 on.

When the switch 153 is on, the substrate potential of the SW element 140 becomes the same voltage as the source, and operates in the same manner as the SW element of the related art. When the switch 152 is on, when the voltage of the substrate voltage regulating power supply 151 is taken to be V151, the substrate potential of the SW element becomes a voltage higher than the source potential by a voltage V151.

When the substrate potential of the SW element 140 is connected to a voltage higher than the source potential by a voltage V151, the threshold voltage Vt of the SW element 140 falls. When the threshold voltage Vt falls, as shown by equation (1), the on resistance of the transistor also falls. If the on resistance of the transistor falls, loss generated when the transistor is on as shown by equation (2) becomes small, and the electrical power conversion efficiency of the SW regulator can be improved.

Typically, when the threshold voltage of the MOS transistor falls, the leakage current when off increases. When the switch element is off, when there is leakage current at the switch element, then there is reactive power, and the electrical power conversion efficiency of the SW regulator falls. However, in the present invention, when the switch element is off, the threshold voltage of the SW element can be made the same as normal, and drops in efficiency due to increases in the leakage current therefore do not occur.

The value of the voltage V151 of the substrate voltage regulating power supply 151 is taken to be a value for causing the substrate potential of the SW element 140 to rise by approximately 0.1 to 0.5 V with respect to the potential of the source of the SW element 140. The threshold voltage Vt of the SW element 140 falls more for a larger value for the voltage V151. The on resistance of the SW element 140 can therefore be lowered but when this lowering is made to exceed 0.6V with respect to the potential of the source of the SW element 140, a parasitic pn junction existing between the source and the substrate of the SW element 140 goes on. It is therefore necessary to set the voltage of V151 to a voltage value in a range where the parasitic pn junction does not go on. Further, the substrate voltage regulating power supply 151 does not have to be a power supply, and can also be a circuit for generating a voltage V151.

In FIG. 5, the substrate potential switching circuit 150 controls the switching on and off of the switches 152 and 153 using a gate signal of the SW element 140 so that the switch 152 is on when the SW element 140 is on, and the switch 153 is on when the switch element 140 is off. The substrate potential switching circuit 150 can also be controlled by separate signals while generating the same results.

Further, the switches 152 and 153 can be replaced with MOS transistors playing the role of simple switches. The same results can also be obtained if the positional relationship of the switch 152 and substrate voltage regulating power supply 151 is replaced.

Sixth Embodiment

Figure 6:
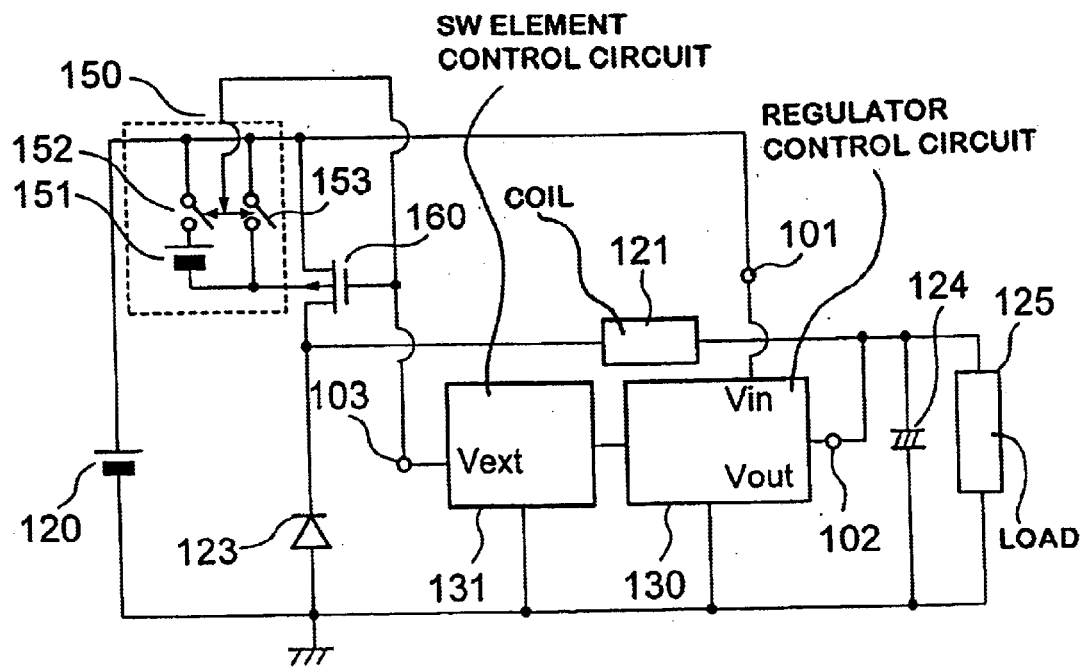
FIG. 6 is a view illustrating a stepping-type SW regulator of a sixth embodiment of the present invention.

An example of a booster-type SW regulator is shown in FIG. 5 but the same results can also be obtained by switching base potentials of a switch element 160 for the kind of booster-type SW regulator shown in FIG. 6. In FIG. 6, the switch element 160 is a P-channel MOS transistor, with a substrate potential switched over by the substrate potential switching circuit 150. When the switch element 160 is on, the switch 152 is on, and when the switch element 160 is off, the switch 153 is on, i.e. the substrate potential when the switch element 160 is off is the same potential as the source of the switch element 160 so that when the switch element 160 is on, the substrate potential of the switch element 160 is lower than the voltage Vin of the input power supply 120 by the voltage V151 of the substrate voltage regulating power supply 151, i.e. is a voltage of Vin−V151. As the substrate potential has fallen, the threshold voltage of the switch element 160 falls, the on resistance falls, and the electrical power conversion efficiency of the switch rises.

Further, the switches 152 and 153 can be replaced with MOS transistors playing the role of simple switches. The same results can also be obtained if the positional relationship of the switch 152 and substrate voltage regulating power supply 151 is replaced.

Seventh Embodiment

Figure 7:
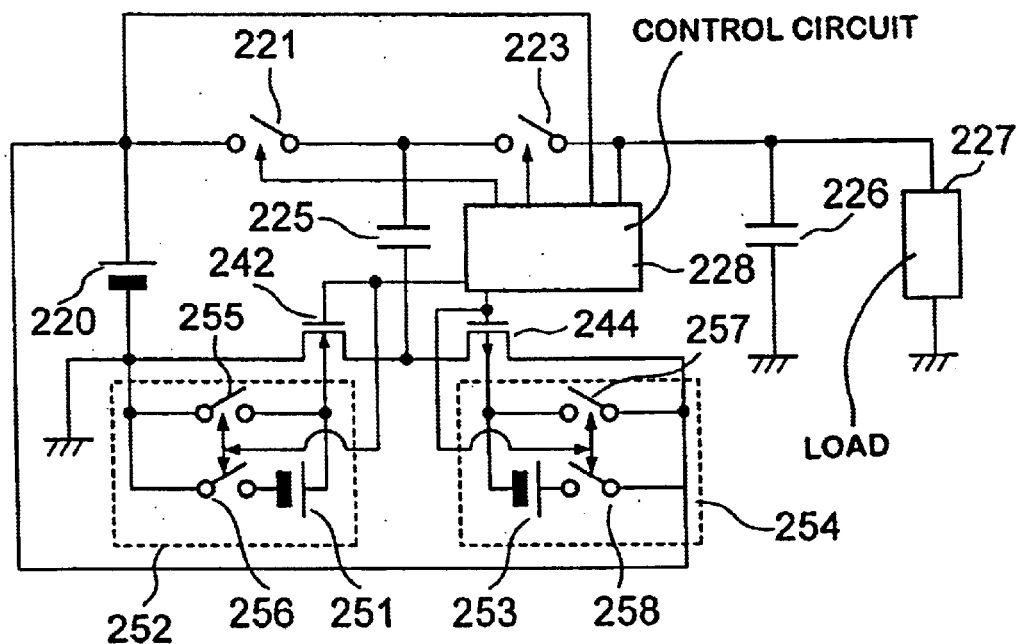
FIG. 7 is a view illustrating a stepping-type CP regulator of a seventh embodiment of the present invention.

FIG. 7 is a CP circuit diagram showing a seventh embodiment of the present invention. The input power supply 220, capacitors 225 and 226, load 227, SW elements 221 and 223 and control circuit 228 are the same as in the related art. In FIG. 7, SW elements 242 and 244 are connected in place of the SW elements 222 and 224 of the related art. The drain, gate, and source of the SW elements 242 and 244 are connected in the same manner as for the SW elements 222 and 224 of the related art but the substrate potentials of the SW elements 242 and 244 can be switched by substrate potential switching circuits 252 and 254. The substrate potential switching circuit 252 receives the same signal as for the gate of the SW element 242 and controls the turning on and off of switches 255 and 256.

Similarly, the substrate potential switching circuit 254 receives the same signal as for the gate of the SW element 244 and controls the turning on and off of switches 257 and 258. First, the initial operation of the substrate potential switching circuit 252 is described. The switches 255 and 256 are made to go on and off in a complementary manner. When the gate signal of the SW element 242 is received and the SW element 242 is on (in this case, when the gate signal is high because the SW element 242 is an N-channel MOS transistor), the switch 256 is on, and when the SW element 242 is off (in this case, when the gate signal is low because the SW element 242 is an N-channel MOS transistor), the switch 255 is on. When the switch element 242 is off, the substrate potential of the SW element 242 becomes the same potential as the source, as in the related art. When the switch element 242 is on, the substrate potential of the SW element 242 becomes a potential higher than the potential of the source by a voltage V251 of the substrate potential regulating power supply 251.

When the substrate potential of the SW element 242 is connected to a voltage higher than the source potential by a voltage V251, the threshold voltage Vt of the SW element 242 falls. When the threshold voltage Vt falls, as shown by equation (1), the on resistance of the transistor also falls. If the on resistance of the transistor falls, loss generated when the transistor is on as shown by equation (2) becomes small, and the electrical power conversion efficiency of the CP circuit can be improved.

Normally, when the threshold voltage of a MOS transistor falls, the leakage current when off increases. When there is then a leakage current when the SW element is turned off, there is reactive power and the electrical power conversion efficiency of the CP circuit falls. However, in the present invention, the threshold voltage of the SW element is the same as normal when the SW element goes off and a fall in efficiency due to an increase in the leakage current does not occur.

The value of the voltage V251 of the substrate voltage regulating power supply 251 is taken to be a value for causing the substrate potential of the SW element 242 to rise by approximately 0.1 to 0.5 V with respect to the potential of the source of the SW element 242. The threshold voltage Vt of the SW element 242 falls more for a larger value for the voltage V251. The on resistance of the SW element 242 can therefore be lowered but when this lowering is made to exceed 0.6V with respect to the potential of the source of the SW element 242, a parasitic pn junction existing between the source and the substrate of the SW element 242 goes on. It is therefore necessary to set the voltage of V251 to a voltage value of a range where the parasitic pn junction does not go on. Further, the substrate voltage regulating power supply 251 does not have to be a power supply, and can also be a circuit for generating a voltage V251.

In FIG. 7, the substrate potential switching circuit 252 controls the switching on and off of the switches 255 and 256 using a gate signal of the SW element 242 so that the switch 256 is on when the SW element 242 is on, and the switch 255 is on when the SW element 242 is off. The substrate potential switching circuit 252 can also be controlled by separate signals while generating the same results.

Next, the initial operation of the substrate potential switching circuit 254 is described. The switches 257 and 258 are made to go on and off in a complementary manner. When the gate signal of the SW element 242 is received and the SW element 242 is on (in this case, when the gate signal is low because the SW element 244 is a P-channel MOS transistor), the switch 258 is on, and when the SW element 244 is off (in this case, when the gate signal is high because the SW element 244 is a P-channel MOS transistor), the switch 257 is on. When the switch element 244 is off, the substrate potential of the SW element 244 becomes the same potential as the source, as in the related art. When the switch element 244 is on, the substrate potential of the SW element 244 becomes a potential lower than the potential of the source by a voltage V253 of the substrate potential regulating power supply 253.

When the substrate potential of the SW element 244 is connected to a voltage lower than the source potential by a voltage V253, the threshold voltage Vt of the SW element 244 falls. When the threshold voltage Vt falls, as shown by equation (1), the on resistance of the transistor also falls. If the on resistance of the transistor falls, loss generated when the transistor is on as shown by equation (1) becomes small, and the electrical power conversion efficiency of the CP circuit can be improved.

Typically, when the threshold voltage of the MOS transistor falls, the leak current when off increases. When the SW element is off, when there is leakage current at the SW element, then there is reactive power, and the electrical power conversion efficiency of the CP circuit falls. However, in the present invention, when the SW element is off, the threshold voltage of the OFF element can be made the same as normal, and drops in efficiency due to increases in the leakage current therefore do not occur.

The value of the voltage V253 of the substrate voltage regulating power supply 253 is taken to be a value for causing the substrate potential of the SW element 244 to rise by approximately 0.1 to 0.5 V with respect to the potential of the source of the SW element 244. The threshold voltage Vt of the SW element 244 falls more for a larger value for the voltage V253. The on resistance of the SW element 244 can therefore be lowered but when this lowering is made to exceed 0.6V with respect to the potential of the source of the SW element 244, a parasitic pn junction existing between the source and the substrate of the SW element 244 goes on. It is therefore necessary to set the voltage of V253 to a voltage value i a range where the parasitic pn junction does not go on. Further, the substrate voltage regulating power supply 253 does not have to be a power supply, and can also be a circuit for generating a voltage V253.

In FIG. 7, the substrate potential switching circuit 254 controls the switching on and off of the switches 257 and 258 using a gate signal of the SW element 244 so that the switch 258 is on when the SW element 244 is on, and the switch 257 is on when the switch element 244 is off. The substrate potential switching circuit 254 can also be controlled by separate signals while generating the same results.

In FIG. 7, the substrate voltage switching of the present invention is implemented with two switches, SW elements 242 and 244, but either one switch is also capable of raising the electrical power conversion efficiency of the CP circuit.

Further, in FIG. 7, the substrate voltage switching of the present invention is implemented with the SW elements 242 and 244, but as with SW elements 221 and 223, when each SW element is turned on, it is apparent that the same results can be obtained by performing reference voltage switching in such a manner that the threshold voltage falls.

In order to increase the electrical power conversion efficiency of the CP circuit, it is preferable to implement the substrate voltage switching of the present invention for a large number of SW elements.

An example of a booster-type CP circuit is shown in FIG. 7 but the same results are also obtained when the present invention is applied to SW elements of a stepping type or booster type CP circuit without detriment to the functions of the product.

Further, the switches 255 and 288 can be replaced with MOS transistors playing the role of simple switches. The same results can also be obtained if the positional relationship of the switch 256 and the substrate voltage regulating power supply 251 or the positional relationship of the switch 258 and substrate voltage regulating power supply 253 are changed.

Eighth Embodiment

In embodiments one to seven, switching of the output transistor and SW element substrate potential is performed but there are cases where substrate potential switching cannot be achieved depending on the impurity of the substrate when a VR circuit, SW regulator control circuit, SW element drive circuit, CP control circuit and SW element etc. are integrated. For example, an n-well is made on a p-type substrate and it is the possible to change the substrate potential of the P-channel MOS transistor by changing the potential of the n-well, in order to make a P-channel MOS transistor within the n-well. However, an N-channel MOS transistor is made on a p-type substrate. Moreover, as the p-type substrate is connected to the lowermost potential of the integrated circuit, the substrate potential of the N-channel MOS transistor cannot be freely switched to the same potential as the p-type substrate.

Figure 8:
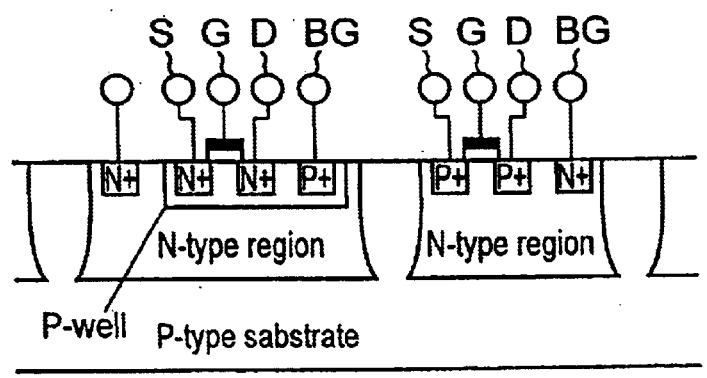
FIG. 8 is a view illustrating an eighth embodiment of the present invention.
Figure 9:
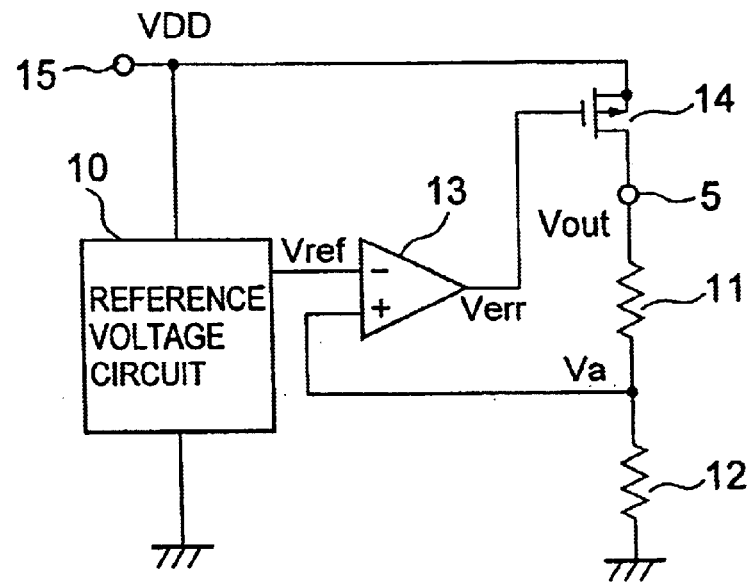
FIG. 9 is a view illustrating a voltage regulator circuit outputting a positive voltage of the related art.
Figure 10:
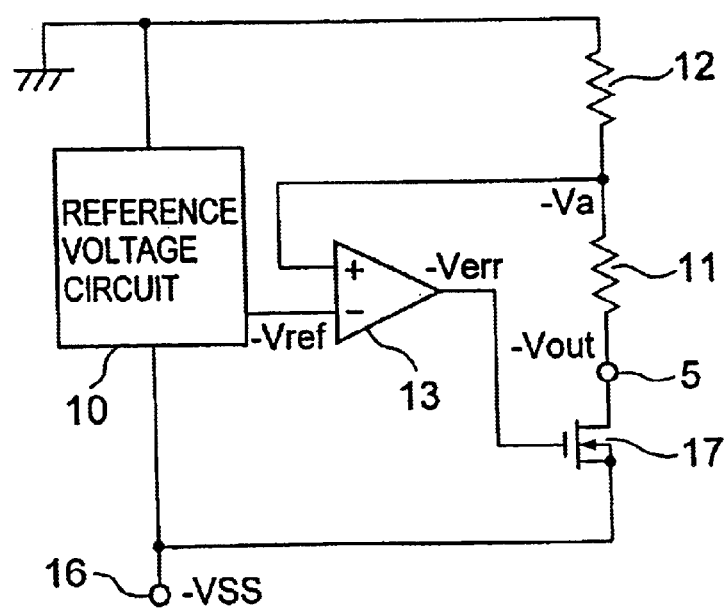
FIG. 10 is a view illustrating a voltage regulator circuit outputting a negative voltage of the related art.
Figure 11:
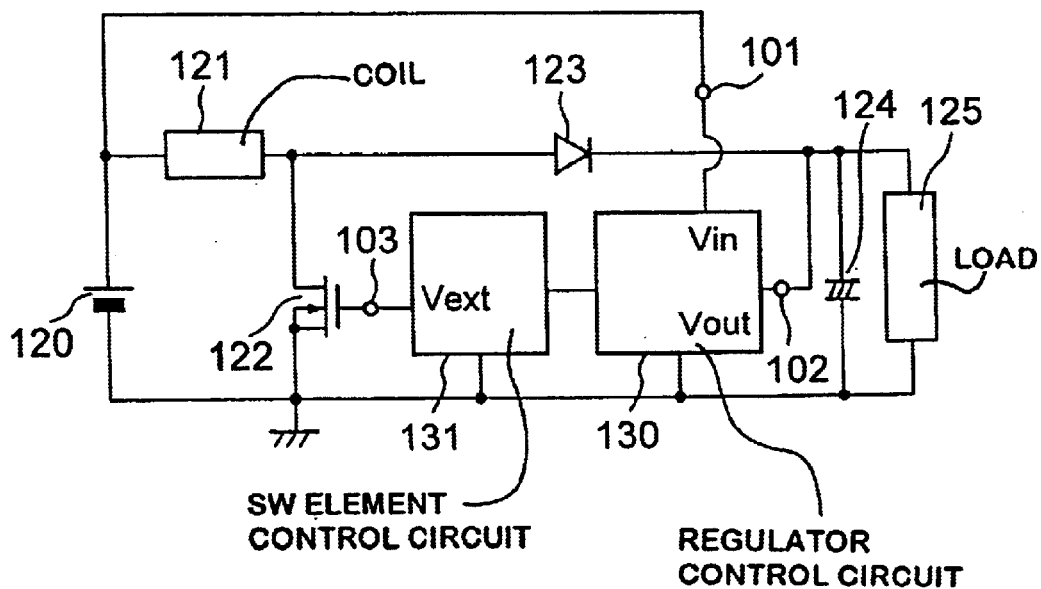
FIG. 11 is a view illustrating an switch regulator control circuit of the related art.
Figure 12:
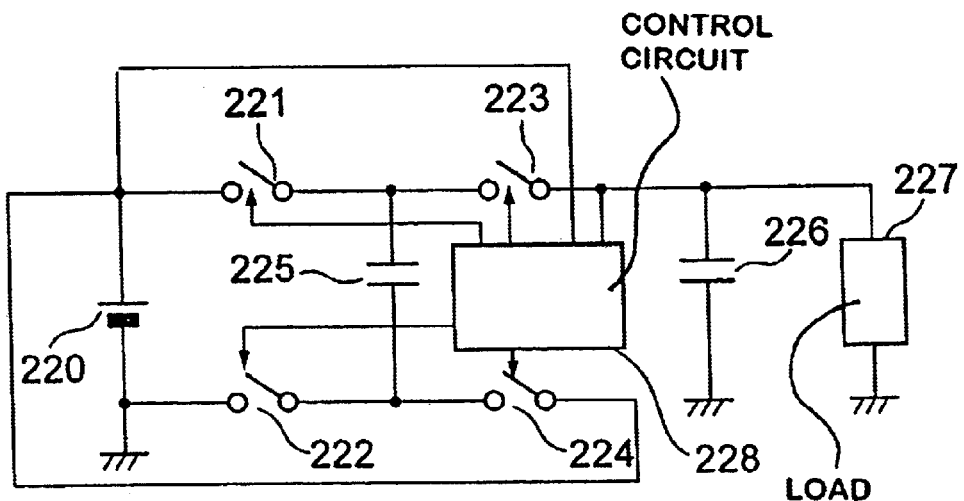
FIG. 12 is a view illustrating a related CP circuit.
Figure 13:
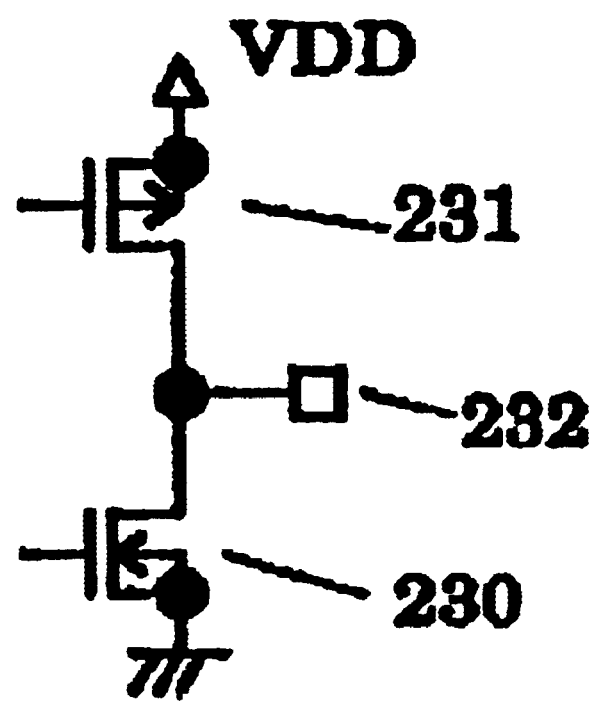
FIG. 13 is a view illustrating a related SW element.

However, the substrate potential of the output transistor of the voltage regulator circuit can be freely changed regardless of the type of impurity of the substrate by providing isolation for the B-CMOS structure shown in FIG. 8. The cross-sectional structure of an isolated N-channel MOS transistor and a P-channel MOS transistor is shown in FIG. 8. An isolated N-type region is provided on a P-type substrate. The P-channel MOS transistor is made in the N-type region, and the substrate potential of the P-channel MOS transistor can then be changed by changing the potential of the N-type region. The N-channel MOS transistor is made in a p-well region within the N-type region, and an N-channel MOS transistor is made within the p-well region. The substrate potential of the N-channel MOS transistor can be changed by changing the potential of the p-well region. The BG terminal is a terminal for supplying substrate potential to the N-channel MOS transistor.

It is therefore apparent that the substrate potential of the output transistor of the voltage regulator circuit can be freely changed for a Bi-CMOS regardless of the type of impurity of the substrate by making the transistors using a Silicon-On-Insulator structure.

As a result of changing the substrate potential of the output transistor, the voltage regulator of the present invention can improve driving ability without increasing the surface area of the output transistor.

The on resistance can therefore be lowered for the SW regulator and CP circuit of the present invention by changing the substrate voltage of the SW elements when the SW elements are on. The electrical power conversion efficiency can therefore be increased while suppressing increases in the surface area of the SW elements.

What is claimed is:

1. A charge pump circuit comprising: a charge transfer device; a MOS switching element connected to the charge transfer device for controlling charge transfer; a drive circuit for turning the switching element on and off; and substrate voltage changing means for selectively changing the substrate voltage of the switching element such that a threshold voltage of the switching element falls when the switching element is turned on.

2. A charge pump circuit according to claim 1; wherein at least some elements constituting the charge pump circuit have a Silicon-On-Insulator configuration.

3. A charge pump circuit according to claim 1; wherein at least some elements constituting the charge pump circuit have a Bipolar-CMOS configuration.

4. A charge pump circuit according to claim 1; wherein the drive circuit has a Silicon-On-Insulator configuration.

5. A charge pump circuit according to claim 1; wherein the drive circuit has a Bipolar-CMOS configuration.

6. A charge pump circuit according to claim 1; wherein the substrate voltage changing means has a Silicon-On-Insulator configuration.

7. A charge pump circuit according to claim 1; wherein the substrate voltage changing means has a Bipolar-CMOS configuration.

8. A charge pump circuit according to claim 1; wherein the MOS switching element has a Bipolar-CMOS configuration.

9. A charge pump circuit according to claim 1; wherein the substrate voltage changing means changes a substrate voltage of the MOS switching element to within a range in which a parasitic pn junction between a source of the MOS switching element and the substrate of the MOS switching element does not turn on.

10. A charge pump circuit according to claim 1; wherein the charge transfer device comprises at least one capacitor for transferring a charge from an input power source to an output terminal of the charge pump circuit.

11. A charge pump circuit for receiving an input voltage and producing an output voltage, comprising:
one or more capacitors connected between an input power source and an output terminal of the charge pump circuit;
one or more switching elements connected to the one or more capacitors for controlling charging of the capacitors to control a level of the output voltage;
a circuit for controlling the conductivity state of the one or more switching elements to maintain a desired output voltage; and
a substrate potential changing circuit connected to the one or more switching elements for changing a substrate potential of the one or more switching elements so as to reduce a threshold voltage thereof.

12. A charge pump circuit according to claim 11; wherein the one or more switching elements comprise transistors; and the substrate potential changing circuit controls the substrate potential of the transistors to reduce a threshold voltage thereof when the transistors are turned on.

13. A charge pump circuit according to claim 11; wherein the one or more switching elements comprise MOS transistors.

14. A charge pump circuit according to claim 11; wherein the one or more switching elements comprise Bipolar-CMOS transistors.

15. A charge pump circuit according to claim 11; wherein the substrate potential changing circuit has a Silicon-On-Insulator configuration.

16. A charge pump circuit according to claim 11; wherein the substrate potential changing circuit has a Bipolar-CMOS configuration.

17. A charge pump circuit according to claim 11; wherein the substrate potential changing circuit changes a substrate potential of the one or more switching elements to within a range in which a parasitic pn junction between a source and the substrate of the switching elements does not turn on.

* * * * *